United States Patent [19]

Kato et al.

[11] Patent Number: 4,500,567
[45] Date of Patent: Feb. 19, 1985

[54] METHOD FOR FORMING TIN OXIDE COATING

[75] Inventors: Yukihiro Kato, Nishinomiya; Hideo Kawahara, Toyonaka; Masato Hyohdou, Itami, all of Japan

[73] Assignee: Nippon Sheet Glass Co., Ltd., Osaka, Japan

[21] Appl. No.: 562,726

[22] Filed: Dec. 19, 1983

[30] Foreign Application Priority Data

Dec. 23, 1982 [JP] Japan .................................. 57-230376
Mar. 7, 1983 [JP] Japan .................................. 58-37136

[51] Int. Cl.³ ........................ C23C 11/00; C23C 13/00
[52] U.S. Cl. .................................. 427/255.3; 427/85; 427/109; 427/126.2; 427/126.3; 427/255; 427/314
[58] Field of Search .................. 427/109, 85, 126.2, 427/87, 126.3, 166, 226, 248.1, 255.2, 255.3, 255, 314; 65/60.52

[56] References Cited

U.S. PATENT DOCUMENTS

| | | | |
|---|---|---|---|
| 2,566,346 | 9/1951 | Lytle et al. | 427/314 |
| 3,107,177 | 10/1963 | Saunders et al. | 427/314 |
| 3,850,679 | 11/1974 | Sopko et al. | 427/255.3 |
| 4,144,362 | 3/1979 | Larkin | 427/226 |
| 4,146,657 | 3/1979 | Gordon | 427/255.3 |
| 4,265,974 | 5/1981 | Gordon | 427/255 |

Primary Examiner—S. L. Childs
Attorney, Agent, or Firm—Wenderoth, Lind & Ponack

[57] ABSTRACT

A method for forming a fluorine-containing tin oxide coating on the surface of a substrate which comprises contacting the heated surface of the substrate with a vapor of monobutyltin trichloride or a mixed vapor of monobutyltin trichloride and a doping agent composed of a fluorine-containing compound of the following formula $$XCHF_2$$

wherein X represents a fluorine atom, a chlorine atom, or a hydrocarbon group consisting only of carbon and hydrogen atoms, to oxidize and decompose the vapor or the mixed vapor thermally and deposit tin oxide or fluorine-containing tin oxide respectively thereon.

4 Claims, 4 Drawing Figures

METHOD FOR FORMING TIN OXIDE COATING

This invention relates to a method for forming a tin oxide coating on the surface of a substrate, and more specifically, to a method which comprises contacting the heated surface of a substrate such as glass, ceramics or metal with a vapor of a specific tin compound to form a tin oxide coating on the surface of the substrate.

A tin oxide coating, because of its excellent hardness, has been widely used to prevent injury to the surfaces of bottles, tableware, etc. Many other uses rely on the semiconducting property of the tin oxide coating. For example, glass having a tin oxide coating formed thereon has been widely used as a transparent conductor such as an electrode plate of a liquid crystal cell or anti-fogging glass. It is also very useful as a coverglass of a solar thermal collector because of its excellent infrared reflecting property.

Methods of adhering a tin oxide film or coating to the surface of glass, etc. are known. One method which has long been used for its suitability for mass production comprises blowing a solution of tin tetrachloride in an organic solvent against the surface of glass, etc. at high temperatures. Recently, a so-called chemical vapor deposition (CVD) method has been widely employed which comprises evaporating tin tetrachloride or dimethyltin dichloride by heating, and contacting the resulting vapor with the surface of glass, etc. at high temperatures (Japanese Laid-Open Patent Publication No. 88097/1973 and Japanese Patent Publication No. 18747/1969. However, many of the tin oxide coatings formed by these methods have cloudiness called "haze", and have unsatisfactory electrical properties, for example high electrical resistance. It is difficult to apply these coatings to glass electrodes for large-sized display devices, which require high transparency, a small thickness and a low electrical resistance value.

A recent successful attempt at reducing the haze of a tin oxide coating is disclosed in Japanese Patent Publication No. 25331/1978 which describes a method of forming a tin oxide coating of considerably reduced haze on the surface of glass which comprises applying dibutyltin diacetate $[(C_4H_9)_2Sn(CH_3COO)_2]$ containing no chlorine atom in its molecule to the glass surface by the CVD technique. The CVD method using dibutyltin diacetate, however, has the defect that the rate of forming the coating is much lower than in the case of using tin tetrachloride or dimethyltin dichloride, and that dibutyltin diacetate chemically changes during heating and the amount of its vapor generated decreases abruptly, leading to a failure of forming a tin oxide coating.

U.S. Pat. No. 4,146,657 (and its corresponding Japanese Laid-Open Patent Publication No. 58363/1980) discloses a CVD method using a gaseous mixture containing an organotin fluorine-bearing compound which is free of any direct tin-fluorine bond and an oxidizable tin compound. This method is suitable for forming a tin oxide coating of excellent electric conductivity on a silicon oxide substrate not containing sodium. But when it is desired to form a tin oxide coating on a substrate containing sodium, for example the surface of soda lime glass, the glass surface must be coated in advance with silicon oxide (SiO or $SiO_2$); otherwise, a tin oxide coating would scarcely be formed.

None of the above-cited prior methods disclose monobutyltin trichloride as a tin compound.

It is an object of this invention to provide an improvement in the CVD method.

Another object of this invention is to provide an improved CVD method which involves using a tin compound that has not been used heretofore in the CVD method.

Still another object of this invention is to provide an improved CVD method by which a tin oxide coating of reduced haze and excellent transparency is rapidly formed.

Yet another object of this invention is to provide an improved CVD method by which a tin oxide coating of reduced haze and excellent electric conductivity is formed on the surface of a substrate.

Further objects and advantages of this invention will become apparent from the following description.

According to this invention, these objects and advantages of the invention can be achieved by a method which comprises contacting the heated surface of a substrate with a vapor of a tin compound to oxidize and decompose the tin compound thermally and form a tin oxide coating on the surface of the substrate, characterized in that said tin compound is monobutyltin trichloride.

According to another aspect of this invention, the above objects and advantages of the invention can be achieved by a method which comprises contacting the heated surface of a substrate with a mixed vapor composed of a tin compound and a doping agent composed of a fluorine-containing compound to decompose and oxidize the mixed vapor thermally and to form a tin oxide coating containing fluorine on the surface of the substrate, characterized in that said tin compound is monobutyltin trichloride and said doping agent is a fluorine-containing compound of the following formula $$XCHF_2$$

wherein X represents a fluorine atom, a chlorine atom, or a hydrocarbon group composed only of carbon and hydrogen atoms.

The invention will be described below in detail partly with reference to the accompanying drawings.

Figure 4:
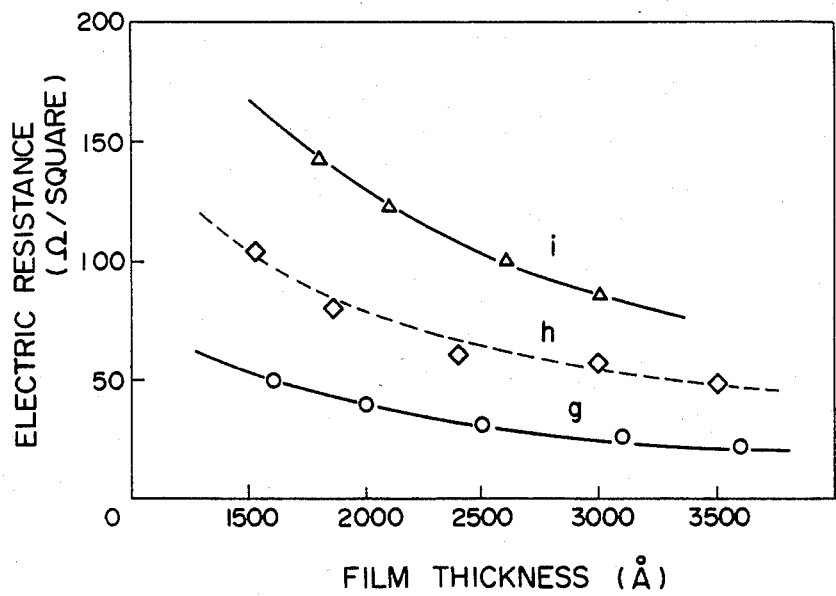

FIG. 4 shows the relation between the thickness of the formed fluorine-containing tin oxide film and its electrical resistance in the CVD method carried out by using monobutyltin trichloride (the method of the invention, curve (g)), dimethyltin dichloride (the conventional method, curve (h)), or dibutyltin diacetate (the conventional method, curve (i)). In these runs, 1,1-difluoroethane was used as a doping agent.

The method of this invention is described with reference to FIG. 1. A vapor of a tin compound containing monobutyltin trichloride is impinged from a slit-like opening 10 against the heated surface of a substrate, for example a glass sheet 11. The surface of the heated substrate is kept, for example, at 350° to 620° C. Monobutyltin trichloride yields a vapor in an evaporator 1 adapted to be heated by a heater. The evaporator is heated suitably to 50° to 150° C. The vapor generated in the evaporator is carried on a carrier gas which has been generated by a compressor 2 and adjusted to a predetermined pressure, for example 0.3 to 3 kg/cm$^2$, by a reduction valve 3, and introduced into a mixer 4 where it is mixed with the carrier gas by a stirrer 9. The mixture is impinged from the opening 10 onto the surface of the heated substrate 11. Nitrogen, for example, is used as a carrier gas. Monobutyltin trichloride thermally reacts with molecular oxygen in the ambient atmosphere on or near the surface of the heated substrate and undergoes oxidation and decomposition, thereby forming a tin oxide coating on the surface of the substrate.

In the aforesaid embodiment of the method of this invention, no doping agent is used. In an embodiment of the method of this invention in which a doping agent is used, the doping agent is sent from a bomb 5 and after passing a reduction valve 3', is adjusted in flow rate (the flow rate is measured by a flowmeter). It is introduced into the mixer 4 via a heated pipe 6 equipped with a heater and a valve 8. The heated pipe is usually kept at 50° to 200° C. The doping agent is thus mixed with monobutyltin trichloride and the carrier gas in the mixer 4. The mixture is impinged from the opening 10 toward the heated surface of the substrate. The heated surface of the substrate is also kept at the aforesaid temperature.

The aforesaid method itself is known in the chemical vapor deposition technique.

In the method of this invention, a fluorine-containing compound of the following formula

XCHF$_2$ wherein X represents a fluorine atom, a chlorine atom, or a hydrocarbon group consisting only of carbon and hydrogen atoms, is conveniently used. The hydrocarbon group preferably has 2 to 4 carbon atoms.

Preferred fluorine-containing compounds of the above formula include, for example, trifluoromethane, monochlorodifluoromethane and 1,1-difluoroalkanes such as 1,1-difluoroethane, 1,1-difluoropropane and 1,1-difluorobutane.

The weight ratio of monobutyltin trichloride to the doping agen used in the method of this invention is preferably from 0.025 to 2.

According to the method of this invention, a tin oxide coating of the desired thickness can be formed on the surface of a substrate with good reproducibility by using monobutyltin trichloride which is a stable liquid at ordinary temperatures and is scarcely degenerated by heating.

Furthermore, according to the method of this invention, a tin oxide coating of much reduced haze as compared with the conventional methods using tin tetrachloride and dimethyltin dichloride can be formed on the surface of a substrate.

Acording to the method of this invention, a tin oxide coating comparable in haze to that obtained from dibutyltin diacetate which has been previously used as a material for forming a tin oxide coating can be obtained.

The present invention can form a tin oxide coating on the surface of a substrate at a very high speed.

The method of this invention using a doping agent can give a tin oxide coating having excellent electric conductivity (for example, a specific resistance of $8 \times 10^{-4}$ ohm-cm or below). A tin oxide coating having higher electric conductivity can be obtained by decreasing the impinging speed of the mixed vapor containing the doping agent and monobutyltin trichloride. In this embodiment, the impinging speed is preferably not more than 15 m/sec, especially preferably 0.2 to 8 m/sec.

The method of this invention using the doping agent also has the advantage that a tin oxide coating having excellent electric conductivity can be formed also on the surface of soda-lime glass.

The tin oxide coating formed by the method of this invention has excellent transparency and electric conductivity, and therefore, a glass sheet having a tin oxide coatin formed by the method of this invention is very suitable for use as an electrode of a liquid crystal cell, an electrode of a solar battery or an infrared-reflecting film.

The following Examples illustrate the present invention more specifically.

EXAMPLE 1

Figure 1:
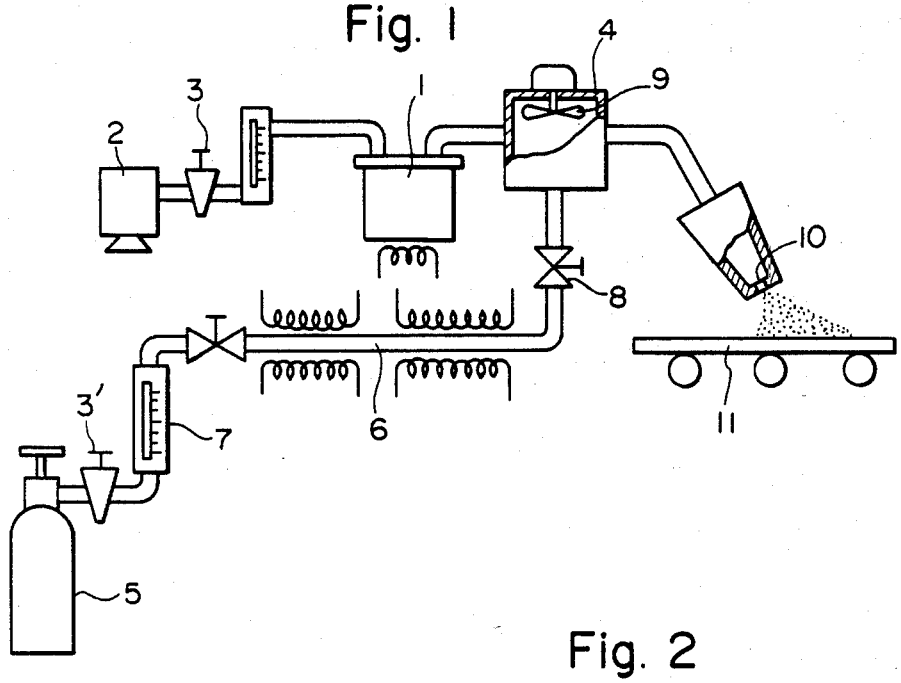
FIG. 1 is a view showing the outline of an apparatus for practicing the method of this invention.

The apparatus shown in FIG. 1 was used. In an evaporator 1, monobutyltin trichloride (C$_4$H$_9$SnCl$_3$) was heated to 150° C. to form its vapor. A carrier gas (nitrogen gas generated by a compressor 2 and maintained at a pressure of 1 kg/cm$^2$ by a reduction valve 3 was sent to the evaporator 1 at a flow rate of 50 liters/min. The vapor of the tin compound was carried on the carrier gas and sent to a mixer 4. The vapor of the tin compound mixed in the mixer 4 was impinged from a slit-like opening 10 provided at the terminal of the piping, and directed against the surface of a glass sheet 11 kept at a high temperature of 575° C. and conveyed by a conveying roller to form a tin oxide coating on the glass surface.

The glass sheet had a thickness of 5 mm, a width of 150 mm and a length of 400 mm and was caused to travel at a speed of 1 m/min. by the conveying roller.

Figure 2:
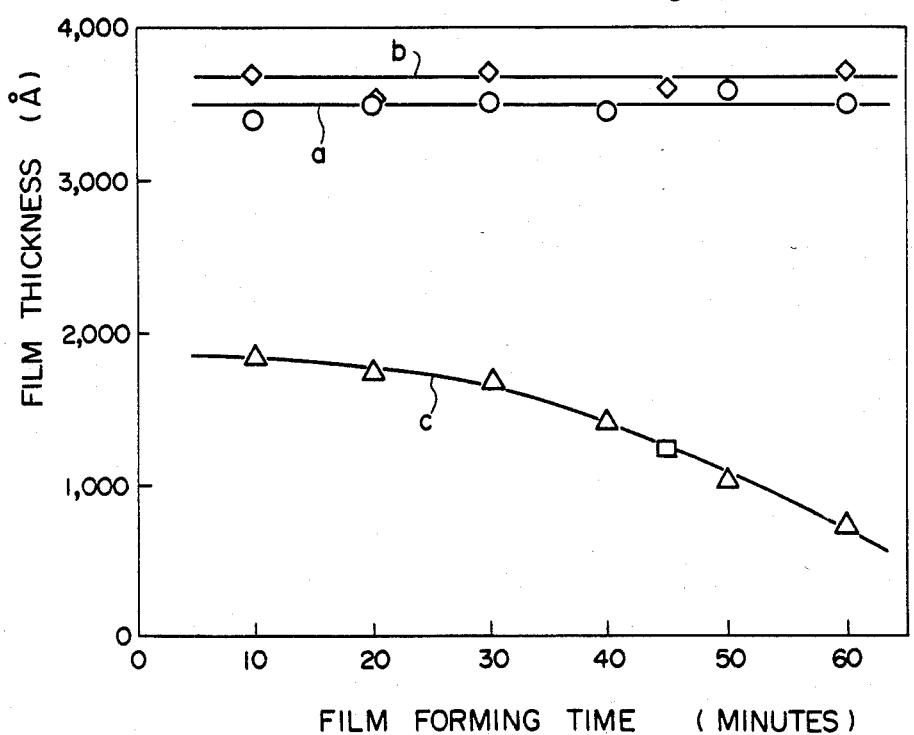
FIG. 2 shows the relation between the film forming time and the film thickness in the CVD method carried out by using monobutyltin trichloride (the method of the invention, curve (a)), tin tetrachloride (the conventional method, curve (b)) or dibuyultin diacetate (the conventional method, curve (c)).

Under the foregoing conditions, the tin oxide coating was formed for 1 hour. The thickness of the resulting tin oxide coating was measured by a Talysurf 4 (a tradename for a surface micro-measuring instrument made by Rank Taylor Hobson Co.). The results are shown by curve a (marked by a circle). In FIG. 2, the abscissa represents the film forming time (minutes), and the ordinate, the thickness (Å) of the tin oxide film.

COMPARATIVE EXAMPLES 1 and 2

Comparative samples were produced in the same way as in Example 1 except that tin tetrachloride (SnCl$_4$) and dibutyltin diacetate [(C$_4$H$_9$)$_2$Sn(CH$_3$COO)$_2$] were used respectively. The thicknesses of the tin oxide films of the comparative samples were measured by the Talysurf, and the results are shown in FIG. 2 by curve b (marked by a tetragon) for tin tetrachloride and by curve c (marked by a triangle) for dibutyltin diacetate.

It is seen from the results shown in FIG. 2 that with the method of the invention using monobutyltin trichloride, the film forming speed was comparable to the method using tin tetrachloride (Comparative Example 1), and that according to the method using dibutyltin diacetate (Comparative Example 2), the rate of film formation is low, and decreases with time.

It was clear at first sight that the tin oxide coatings obtained by the methods of Example 1 and Comparative Example 2 showed low haze, whereas the tin oxide coating obtained by the method of Comparative Example 1 showed high haze.

EXAMPLE 2 AND COMPARATIVE EXAMPLES 3 AND 4

A tin oxide coating was formed on the surface of a glass sheet in the same way as in Example 1 except that the flow rate of the carrier gas was gradually changed from 20 liters/min. to 150 liters/min.

By changing the flow rate of the carrier gas, the thickness of the resulting tin oxide coating was changed with time, and the relation between the thickness of the coating and its haze was examined.

Figure 3:
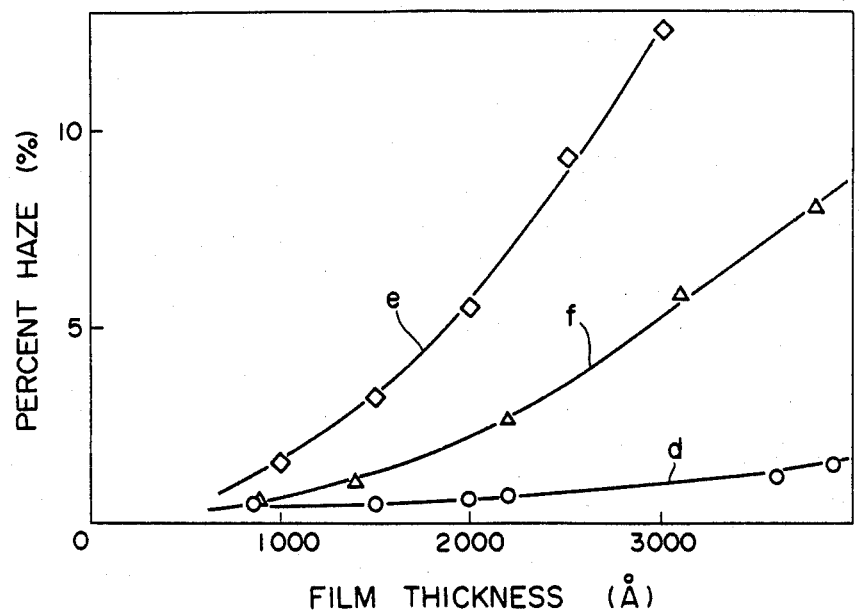
FIG. 3 shows the relation between the thickness of the formed tin oxide film and its haze in the CVD method carried out by using monobutyltin trichloride (the method of the invention, curve (d)), tin tetrachloride (the conventional method, curve (e)) or dimethyltin dichloride (the conventional method, curve (f)).

Furthermore, comparative samples were produced in the same way as in Example 2 using tin tetrachloride ($SnCl_4$) and dimethyltin chloride [$(CH_3)_2SnCl_2$]. The percent hazes of the resulting tin oxide coatings were measured by a hazemeter (Model NDL-20H, made by Nippon Denshoku Kabushiki Kaisha). Their thicknesses were measured by the Talysurf. The results of measurements are shown in FIG. 3. In FIG. 3, the curve d refers to the results obtained in Example 2; the curve e, to the results obtained in Comparative Example 3 ($SnCl_4$); and the curve f, to the results obtained in Comparative Example 4 (dimethyltin dichloride).

It will be understood from FIG. 3 that the method of this invention in which monobutyltin trichloride was used, a tin oxide coating having a low percent haze was obtained.

EXAMPLE 3 AND COMPARATIVE EXAMPLES 5 AND 6

A device for supplying a doping agent was attached to the apparatus used in Example 1 as shown in FIG. 1, and the formation of a tin oxide coating doped with fluorine was attempted.

1,1-Difluoroethane ($CH_3CHF_2$) as a doping agent was sent from a bomb 5, went past a reduction valve 3', and a flowmeter 7, and was introduced into the mixer 4 via a heated piping 6 and a valve 8. In the mixer 4, the doping agent was mixed with the tin compound by a fan 9.

A tin oxide coating doped with fluorine was formed on the surface of a glass sheet in the same way as in Example 2 except that 1,1-difluoroethane was generated in the bomb 5 and sent to the mixer 4 at a rate of 10 liters/min.

Furthermore, comparative samples were produced in the same way as in Example 3 using dimethyltin dichloride (Comparative Example 5) and dibutyltin diacetate (Comparative Example 6).

The area electrical resistances (ohms/square) of the resulting tin oxide coatings were measured, and their thicknesses were measured by the Talysurf. The results of measurements are shown in FIG. 4.

In FIG. 4, the curve g refers to the results of Example 3; the curve h, to the results of Comparative Example 5; and the curve i, to the results of Comparative Example 6.

It is seen from FIG. 4 that the tin oxide obtained by this invention has excellent electrical properties.

It is seen from Examples 1 to 3 that by the method of this invention, a tin oxide coating having a low percent haze and a low electrical resistance can be formed at a fast rate of formation.

EXAMPLES 4 to 6 AND COMPARATIVE EXAMPLES 7 TO 9

The same apparatus as used in Example 3 was used.

Monobutyltin trichloride was heated to 40° to 90° C. in the evaporator 1 to generate its vapor. Nitrogen gas as a carrier gas was adjusted to a pressure of 1 kg/cm$^2$ and a flow rate of 30 liters/min. Monochlorodifluoromethane (Cl—$CHF_2$), trifluoromethane (F—$CHF_2$) or 1,1-difluoroethane ($CH_3$—$CHF_2$) was used as a doping agent. A vapor of monobutyltin trichloride mixed with any of these doping agents in the mixer 4 was impinged from the opening 10 and directed against the surface of soda-lime glass (thickness 3 mm, width 30 mm, length 300 mm) or soda-lime glass having an $SiO_2$ coating (thickness 1000 Å) (having the same size as above) which was heated at 520° C. and conveyed at a speed of 20 cm/min.

The mixing proportion of the doping agent was the one which made the electrical resistance of the resulting tin oxide coating lowest. The clearance between the tip of the slit-like opening and the surface of the glass was set at 10 mm, and the speed of discharging the entire gas blown from the slit-like opening was adjusted to 0.8 m/sec.

By the foregoing procedure, a tin oxide coating containing fluorine and having a thickness of 2000 Å was formed on the surface of the glass.

The specific electrical resistances of the tin oxide coatings obtained are shown in Table 1.

For comparison, a tin oxide coating having a thickness of 2000 Å was formed in the same way as in Examples 4 to 6 except that tetramethyltin was used as the tin compound and bromotrifluoromethane, as the doping agent. The specific electric resistances of the resulting tin oxide coatings were measured, and the results are shown in Table 1.

Since tetramethyltin was gas, it was directly fed into the mixer 4 from the bomb.

TABLE 1

| | | Starting materials | | Specific resistance (ohms-cm) | |
| --- | --- | --- | --- | --- | --- |
| | | Tin compound | Doping agent | Soda-lime glass substrate | $SiO_2$—coated soda-lime glass substrate |
| Example | 4 | Monobutyltin trichloride | Monochlorodifluoromethane | $7.8 \times 10^{-4}$ | $4.7 \times 10^{-4}$ |
| | 5 | Monobutyltin trichloride | Trifluoromethane | $1.1 \times 10^{-3}$ | $9.0 \times 10^{-4}$ |
| | 6 | Monobutyltin trichloride | 1,1-Difluoroethane | $7.4 \times 10^{-4}$ | $4.7 \times 10^{-4}$ |
| Comparative Example | 7 | Tetrabutyltin | Bromotrifluoromethane | Scarcely any tin oxide coating formed. | $5.9 \times 10^{-3}$ |

TABLE 1-continued

| | Starting materials | | Specific resistance (ohms-cm) | |
| | | | Soda-lime glass substrate | $SiO_2$—coated soda-lime glass substrate |
| --- | --- | --- | --- | --- |
| 8 | Dibutyltin diacetate | Bromotrifluoromethane | $2.7 \times 10^{-3}$ | $2.7 \times 10^{-3}$ |
| 9 | Tetramethyltin | Bromotrifluoromethane | Scarcely any tin oxide coating formed. | $1.1 \times 10^{-3}$ |

It is seen from Table 1 that the tin oxide coatings formed in Examples 4 to 6 have higher electric conductivity than the tin oxide coatings formed in Comparative Examples 7 to 9.

It is also seen that when tetramethyltin is used as the tin compound and bromotrifluoromethane as the doping agent, a tin oxide coating having relatively good electric conductivity can be formed on soda-lime glass coated with $SiO_2$, but it is impossible to form a tin oxide coating directly on soda-lime glass.

What is claimed is:

1. In a method for forming a fluorine-containing tin oxide coating on the surface of a substrate selected from the group consisting of glass, ceramics and metals which comprises contacting the heated surface of the substrate with a mixed vapor of a tin compound and a doping agent composed of a fluorine-containing compound to oxidize and decompose the mixed vapor thermally and deposit fluorine-containing tin oxide thereon; the improvement wherein monobutyltin trichloride is used as the tin compound, and a fluorine compound of the following formula $XCHF_2$ wherein X represents a fluorine atom, a chlorine atom, or a hydrocarbon group consisting only of carbon and hydrogen atoms, is used as the doping agent.

2. The method of claim 1 wherein the doping agent is trifluoromethane or monochlorodifluoromethane.

3. The method of claim 1 wherein the doping agent is a 1,1-difluoroalkane having 2 to 4 carbon atoms.

4. The method of claim 3 wherein the 1,1-difluoroalkane is 1,1-difluoroethane.

* * * * *